(12) United States Patent
Delgado et al.

(10) Patent No.: US 7,518,236 B2
(45) Date of Patent: Apr. 14, 2009

(54) POWER CIRCUIT PACKAGE AND FABRICATION METHOD

(75) Inventors: Eladio Clemente Delgado, Burnt Hills, NY (US); Richard Alfred Beaupre, Pittsfield, MA (US)

(73) Assignee: General Electric Company, Niskayuna, NY (US)

( * ) Notice: Subject to any disclaimer, the term of this patent is extended or adjusted under 35 U.S.C. 154(b) by 454 days.

(21) Appl. No.: 11/259,992

(22) Filed: Oct. 26, 2005

(65) Prior Publication Data

US 2007/0090464 A1 Apr. 26, 2007

(51) Int. Cl.
*H01L 23/34* (2006.01)

(52) U.S. Cl. ............ 257/723; 257/678; 257/724; 438/6; 438/67; 438/406; 438/455

(58) Field of Classification Search ......... 257/678, 257/685, 686, 723, 724, 726, E25.031, E25.032, 257/E23.042; 438/6, 28, 66, 67, 107, 109, 438/406, 455–459, FOR. 211–FOR. 220, 438/FOR. 365–FOR. 368
See application file for complete search history.

(56) References Cited

U.S. PATENT DOCUMENTS

| | | | |
|---|---|---|---|
| 4,754,371 A * | 6/1988 | Nitta et al. ............... 361/779 |
| 4,810,563 A | 3/1989 | DeGree et al. |
| 5,683,928 A | 11/1997 | Wojnarowski et al. |
| 5,841,193 A * | 11/1998 | Eichelberger ............ 257/723 |
| 5,849,623 A | 12/1998 | Wojnarowski et al. |
| 5,866,952 A * | 2/1999 | Wojnarowski et al. ...... 257/788 |
| 5,872,040 A | 2/1999 | Wojnarowski et al. |
| 6,040,226 A | 3/2000 | Wojnarowski et al. |
| 6,232,151 B1 | 5/2001 | Ozmat et al. |
| 6,306,680 B1 | 10/2001 | Fillion et al. |
| 6,377,461 B1 | 4/2002 | Ozmat et al. |
| 6,396,153 B2 | 5/2002 | Fillion et al. |
| 6,680,529 B2 * | 1/2004 | Chen et al. ................ 257/700 |
| 6,734,534 B1 * | 5/2004 | Vu et al. ................... 257/782 |
| 6,942,360 B2 | 9/2005 | Chou et al. |
| 7,042,074 B2 * | 5/2006 | Gobl et al. ................ 257/678 |
| 7,179,681 B2 * | 2/2007 | Bolken et al. ............. 438/106 |
| 2007/0145558 A1 * | 6/2007 | Chia et al. ................ 257/723 |

OTHER PUBLICATIONS

Commonly-Owned U.S. Appl. No. 10/998,707, filed Nov. 24, 2004, by L.D. Stevanovic, et al., Entitled "Heat Sink With Microchannel Cooling for Power Devices".

(Continued)

*Primary Examiner*—Jasmine J Clark
(74) *Attorney, Agent, or Firm*—Ann M. Agosti

(57) ABSTRACT

A power circuit package includes a base including a substrate, a plurality of interconnect circuit layers over the substrate with each including a substrate insulating layer patterned with substrate electrical interconnects, and via connections extending from a top surface of the substrate to at least one of the substrate electrical interconnects; and a power semiconductor module including power semiconductor devices each including device pads on a top surface of the respective power semiconductor device and backside contacts on a bottom surface of the respective power semiconductor device, the power semiconductor devices being coupled to a membrane structure, the membrane structure including a membrane insulating layer and membrane electrical interconnects over the membrane insulating layer and selectively extending to the device pads, wherein the backside contacts are coupled to selected substrate electrical interconnects or via connections.

21 Claims, 4 Drawing Sheets

OTHER PUBLICATIONS

Commonly-Owned U.S. Appl. No. 10/998,798, filed Jan. 24, 2004, by L.D. Stevanovic, et al., Entitled "Power Module, Phase Leg and Three-Phase Inverter".

The Bergquist Co., "Thermal Clad Selection guide", Jan. 2002, pp. 4-7.

* cited by examiner

POWER CIRCUIT PACKAGE AND FABRICATION METHOD

BACKGROUND

The invention relates generally to power circuit packages and fabrication methods.

High power semiconductor modules are generally packaged with brazed or direct bond copper to ceramic substrates. Such packaging is expensive and thus typically limited to high performance applications. Some expense has been mitigated by reducing the amount of substrate material, and some reliability has increased when power overlay assemblies such as described in commonly assigned Ozmat et al. U.S. Pat. No. 6,377,461 are used to replace wire bonds. Additional costs savings and reliability improvements would be desirable.

BRIEF DESCRIPTION

Briefly, in accordance with one embodiment of the present invention, a power circuit package comprises a base and a power semiconductor module. The base comprises a substrate and a plurality of interconnect circuit layers over the substrate. Each interconnect circuit layer comprises a substrate insulating layer patterned with substrate electrical interconnects. The base further includes via connections extending from a top surface of the substrate to at least one of the substrate electrical interconnects. The power semiconductor module comprises power semiconductor devices each comprising device pads on a top surface of the respective power semiconductor device and backside contacts on a bottom surface of the respective power semiconductor device with the power semiconductor devices being coupled to a membrane structure. The membrane structure comprises a membrane insulating layer and substrate electrical interconnects over the membrane insulating layer and selectively extending to the device pads. The backside contacts are coupled to selected substrate electrical interconnects or via connections.

In accordance with another embodiment of the present invention, a method for fabricating a power circuit package comprises: providing a base comprising a substrate, a plurality of interconnect circuit layers over the substrate with each comprising a substrate insulating layer patterned with substrate electrical interconnects, and via connections extending from a top surface of the substrate to at least one of the electrical interconnects; providing a power semiconductor module comprising power semiconductor devices each comprising device pads on a top surface and backside contacts on a bottom surface, the power semiconductor devices being coupled to a membrane structure, the membrane structure comprising a membrane insulating layer and membrane electrical interconnects over the membrane insulating layer and selectively extending to the device pads; and mounting the power semiconductor module to selected electrical interconnects or via connections of the base.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
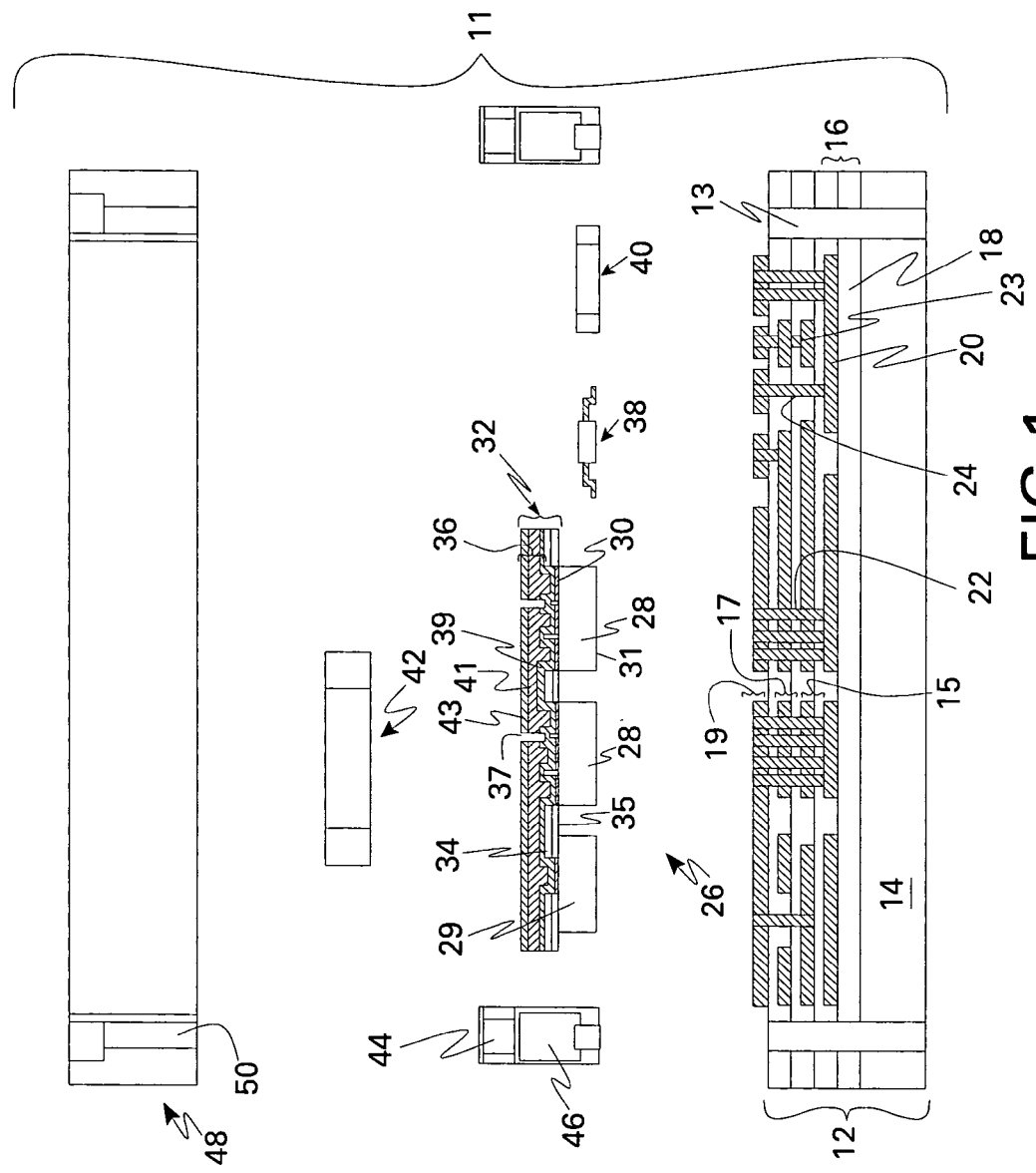
FIG. 1 is a sectional expanded view of the components for a power circuit package in accordance with one embodiment of the present invention.
Figure 2:
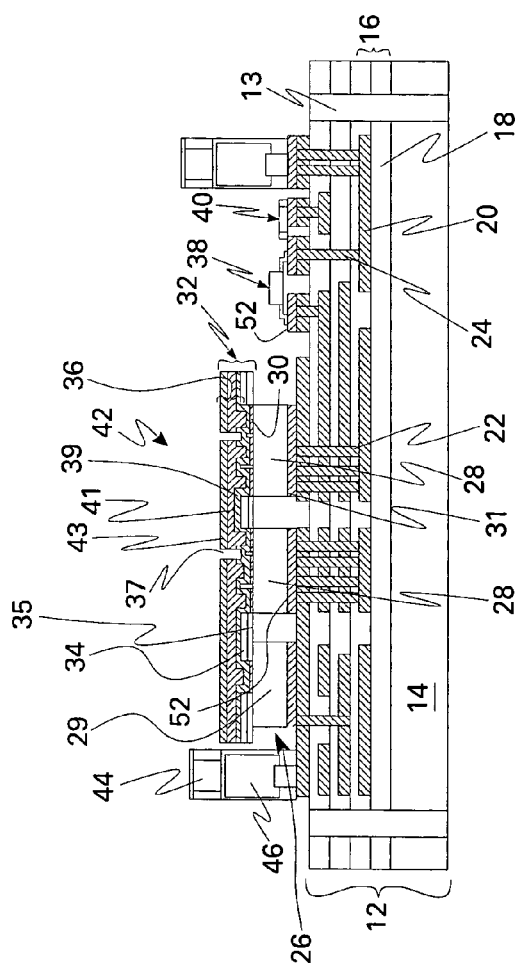
FIG. 2 is a sectional side view of a soldering stage in accordance with one embodiment of the present invention.
Figure 3:
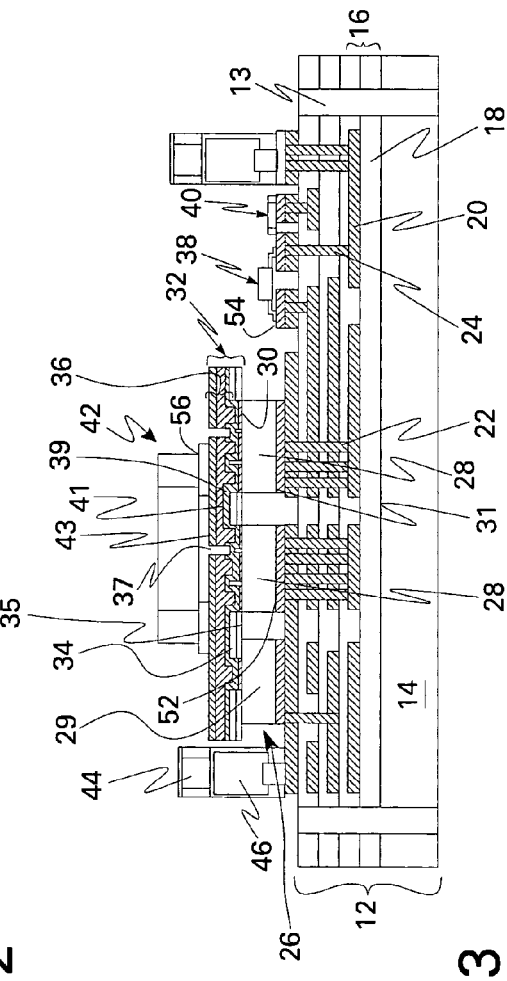
FIG. 3 is a sectional side view of a soldering stage in accordance with another embodiment of the present invention.
Figure 4:
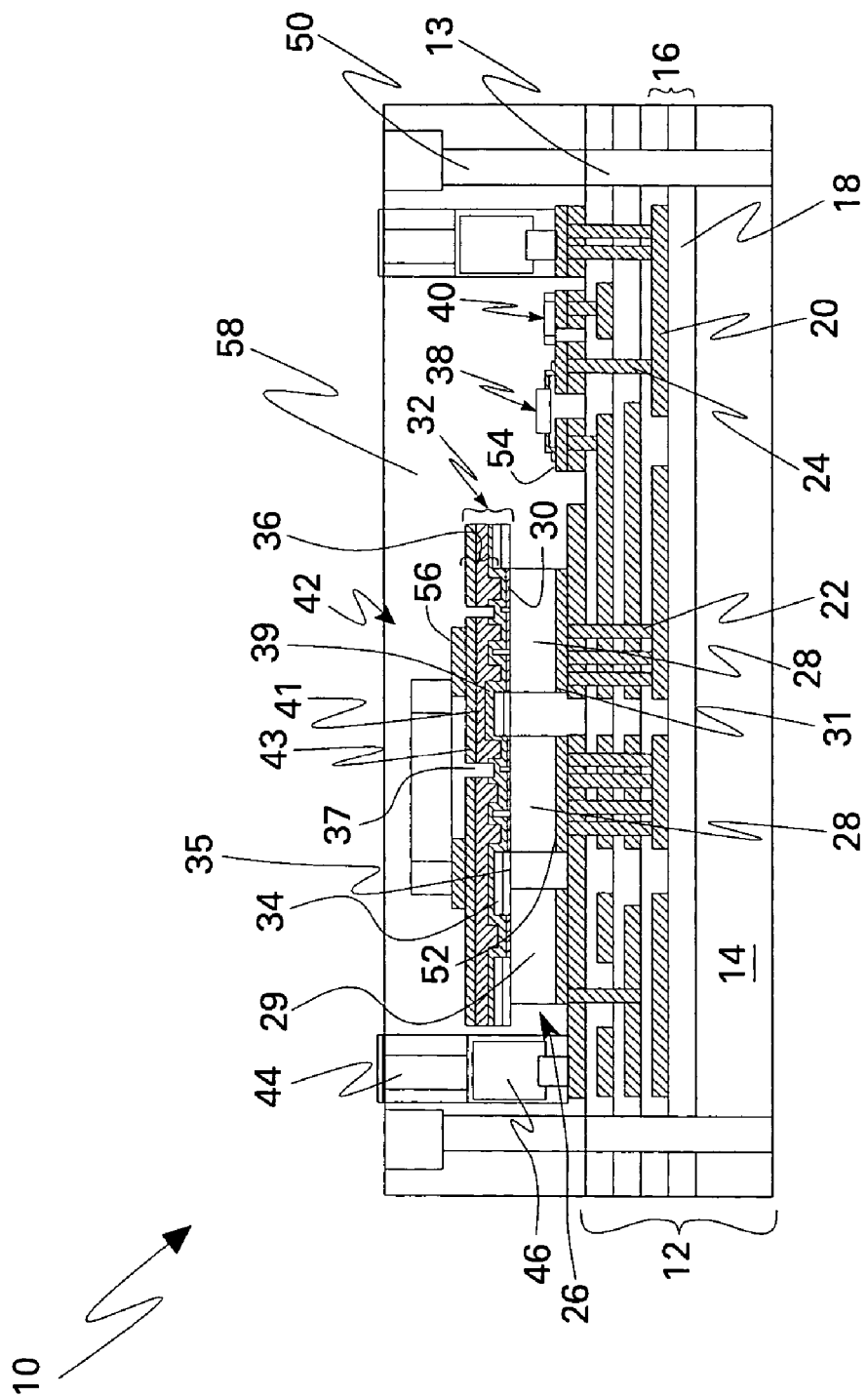
FIG. 4 is a sectional side view of a power circuit package in accordance with one embodiment of the present invention.

FIG. 1 is a sectional expanded view of components 11 for a power circuit package in accordance with various embodiments of the present invention. FIG. 2 is a sectional side view of a soldering stage in accordance with one embodiment of the present invention, FIG. 3 is a sectional side view of a soldering stage in accordance with another embodiment of the present invention, and FIG. 4 is a sectional side view of a power circuit package 10 in accordance with one embodiment of the present invention which uses the components shown in FIG. 1.

In an exemplary embodiment of the present invention power circuit package 10 comprises a base 12 and a power semiconductor module 26. Base 12 comprises a substrate 14, a plurality of interconnect circuit layers 16 over substrate 14 with each comprising a substrate insulating layer 18 patterned with substrate electrical interconnects 20. Base 12 further comprises via connections 22, 24 extending from a top surface of substrate 14 to at least one of the substrate electrical interconnects 20. Power semiconductor module 26 comprises power semiconductor devices 28 each comprising device pads 30 on a top surface of the respective power semiconductor device and backside contacts 31 on a bottom surface of the respective power semiconductor device. Power semiconductor devices 28 are coupled to a membrane structure 32 which comprises a membrane insulating layer 34 and membrane electrical interconnects 36 over membrane insulating layer 34 and selectively extending to device pads 30. Backside contacts 31 are coupled to selected substrate electrical interconnects 20 or via connections 22, 24.

Word such as "top," "bottom," and "over" are used herein for purposes of illustration but not intended to limit the physical orientation of the structure during fabrication or operation. Any dimensional and component values given herein are exemplary only for purposes of illustration and are not intended to limit the scope of the invention described herein. Similarly, specific materials are exemplary only for purposes of illustration.

Substrate 14 may comprise any structurally appropriate material and typically comprises a material which is not electrically conductive or an electrically conductive material which is coated by an electrically insulating material. It is also beneficial to select substrates with low thermal impedances to allow heat to pass from power semiconductor devices 28. In one example, substrate 14 comprises a structure that is known in the trade as an insulated metal substrate (IMS). In a more specific example, the conductive portion of the IMS comprises copper or an aluminum silicon carbide metal matrix composite.

Substrate insulating layers 18 typically comprise a non-electrically conductive material such as a ceramic filled epoxy based laminate, a polyimide, or a ceramic. In one example, the thickness of a substrate insulating layer 18 is about 0.008 inches (0.2 millimeters). A substrate insulating layer adjacent to a an electrically conductive substrate may act as the insulation for the electrically conductive substrate. As used in the context of interconnect circuit layer 16, a substrate insulating "layer" 18 means "at least one layer" (that is, layer 18 may comprise a single layer or several overlying layers).

Substrate electrical interconnects 20 are patterned to provide desired electrical paths and typically comprise a material such as copper. Substrate electrical interconnects 20 may comprise a uniform material or layers of material if desired to improve adhesion or finishing. In one example, a substrate electrical interconnect has a thickness of about 0.0058 inch (0.15 millimeters).

Depending upon the nature of the components to be attached, a via connection 22 or 24 is used to provide an electrical path, a thermal path, or an electrical and thermal path. Typical materials for via connections 22, 24 include materials such as copper. The diameter size and number of via connections per component will also vary according to the component with diameter size, number of via connections, or both increasing as thermal or electrical needs increase. If desired, additional buried via connections may be used to interconnect intermediate substrate electrical interconnects as shown by via connection 23 in FIG. 1.

Straight via connections are illustrated merely for purposes of example. Typically via connections, when spanning multiple substrate insulating layers, are formed by removing the desired portion of the substrate insulating layer and applying the electrically conductive material on an insulating-layer by insulating-layer basis. For example, referring to FIG. 1, after patterning of its respective substrate insulating layer, via connection portion 17 is formed directly over and coupled to via connection portion 15, and later, after patterning of its respective substrate insulating layer, via connection 19 is formed directed over and coupled to via connection portion 17. If it is not possible to fill the entire space within a via connection with the electrically conductive material, filler material (not shown) can be applied to an interior portion of the via connection to prevent voids. For via connections providing thermal paths, any such filler material typically comprises a thermally conductive material.

Although not required, it is useful to provide a base pathway 13 for later coupling of the resulting power circuit package into an assembly in which it will be mechanically fastened and cooled.

Power semiconductor devices 28 of power semiconductor module 26 include devices such as diodes, transistors, integrated gate bipolar transistors, or any type of power semiconductor or other semiconductor having multiple functions for control or sensing. Power shims may be used to couple connections from a top side of a power semiconductor device 28 down to base 12. One such power shim 29 is shown for purposes of example.

Exemplary embodiments of power semiconductor modules are described in aforementioned U.S. Pat. No. 6,377,461. Membrane structure 32 may comprise either a single layer structure (as shown) or a multi-layer structure (not shown for the membrane structure but of the type shown with respect to the interconnect circuit layers 16 of base 12).

Membrane insulating layer 34 typically comprises an organic dielectric material such as a polymer or, in an even more specific embodiment, a polyimide. Other example materials include polyetherimide such as ULTEM® polyetherimides (General Electric) or UPIMOL® resins (UBE Industries). If desired, ceramic filler materials may be included, as described in aforementioned U.S. Pat. No. 6,377, 461.

Membrane electrical interconnects 36 typically comprise a metal such as copper. The embodiment of FIG. 1 illustrates a more specific layered electrical interconnect embodiment comprising a starter layer 39, a primary layer 41, and a finish layer 43. In an even more specific embodiment, starter layer 39 comprises titanium, primary layer 41 comprises copper with a thickness of about 0.005 inches (0.13 millimeters), and finish layer 43 comprises nickel-gold. The membrane electrical interconnects have spaces 37 therebetween to separate electrical paths.

In one embodiment, power semiconductor devices 28 are attached to membrane structure 32 with an adhesive 35 such as a glue or a partially cured polymer resin. If desired, the membrane structure may further include integral passive elements (not shown) of the type described in commonly assigned Wojnarowski et al. U.S. Pat. Nos. 5,683,928 , 5,849, 623 , 5,872,040, and 6,040,226.

Backside contacts 31 are coupled to selected substrate electrical interconnects 20 or via connections 22, 24. As used herein, "or" means either one or both. Typically coupling is achieved by use of any suitable solder 52. In one embodiment, the solder comprises a screen printed solder paste.

Applying power semiconductor module 26 to base 12 which already has substrate electrical interconnects 20 thereon provides many advantages including, for example, enabling a simple technique for increased reliability and functionality by integrating a low thermal impedance base with interconnections, which may be used for power and signal purposes, in combination with the power semiconductor module.

Additional advantages can be achieved by coupling surface mount components 38, 40, and 42. In a more specific embodiment, as shown in FIGS. 2-5, surface mount components 38 and 40 are coupled to selected substrate electrical interconnects 20 or via connections 22, 24. This embodiment gains even more benefit from having the interconnect circuit layers 16 of base 12 because surface mount components 38 and 40 are positioned on a common plane as power semiconductor module 26.

In one further embodiment, surface mount components 38 and 40 are soldered simultaneously along with power semiconductor module 26 as represented by use of a common solder 52 in FIG. 2. In another embodiment, a multi-step soldering process is used. Multi-step embodiments are useful, for example, in mounting a specific layer of components first, and then, with a lower temperature solder, adding additional components to another layer of the structure. For another example, in one embodiment, as shown in FIG. 4, at least two types of solder are used for coupling of the power semiconductor module and the surface mount components. In this embodiment, one type of solder 52 is used for coupling the power semiconductor module having a higher reflow temperature than another type of solder 54 which is used for coupling at least one surface mount component.

Surface mount components 38 and 40 typically comprise at least one component selected from the group consisting of passive surface components and active surface components. Examples of passive surface components include resistors, capacitors, and inductors. Examples of active surface components include gate drive circuits, current sensors, voltage sensors, thermal sensors, processing electronics (which may be wired or wireless and may include components such as level shifters, converters, filters, and preamplifiers, for example), optoelectronics, and conditioning electronics.

In one embodiment, as shown in FIG. 4, potting material 58 at least partially surrounds power semiconductor module 26. Examples of appropriate potting materials include epoxies and silicones. One useful technique for applying the potting material is to use a frame 50. In one embodiment, frame 50 is coupled to the top surface of the substrate for supporting the potting material as it is poured or injected into the cavity formed by base 12 and frame 50. Typically, underfill material (not shown) is provided in the spaces between power semiconductor devices 28 under power semiconductor module 26 prior to application of potting material 58 by any appropriate technique with capillary action filling being one example.

Frame 50 may remain in position for fabrication ease or structural support. Alternatively, frame 50 may be removed after the potting material has been provided. If frame 50 remains in position, it is useful to provide frame 50 with frame pathways 50 to line up to any base pathways 13.

Output connectors 44 may additionally be coupled to selected substrate electrical interconnects 20 or via connections 22, 24. Typically output connectors 44 are provided before the application of potting material 58 so that the potting material partially surrounds the output connectors in a manner that output connectors 44 remain accessible for external coupling. In one example, output connectors 44 include output connector pathways 46 for receiving external plugs (not shown).

Figure 5:
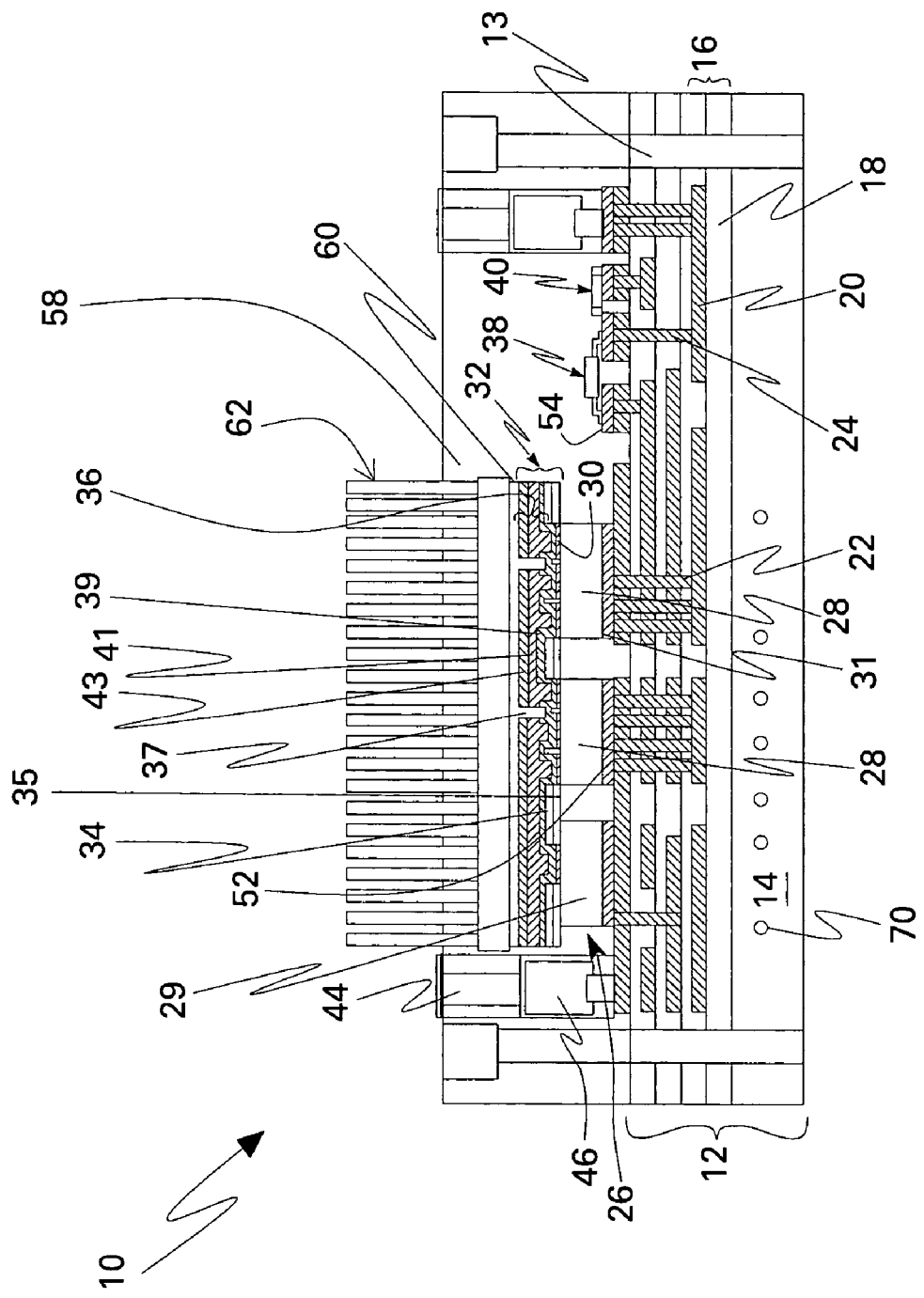
FIG. 5 is a sectional side view of a power circuit package in accordance with another embodiment of the present invention.

Surface mount components 42 may further include components which are mounted to a top surface of power semiconductor module 26 (typically with solder 56). Or, in an alternative embodiment, cooling is provided on both sides of the power semiconductor module by thermal and electrical via connections 22 on a bottom surface and by a cooling mechanism on the top surface. In one top surface cooling example, as shown in FIG. 5, a heat exchanger 62 is coupled to a top surface of the membrane structure by a thermal interface material 60.

Thermal interface material 60 comprises a thermally conductive material which is either electrically insulating or, if electrically conductive, includes an electrical insulator layer (not shown) as its top surface for positioning adjacent heat exchanger 62. In one embodiment, thermal interface material 50 comprises a ceramic filled polymer pad such as SARCON XR-M™ available from Fujipoly America Corp. Other example materials for thermal interface material 60 include ceramic filled silicone, carbon fiber filled pads, and conventional thermal greases. Heat exchanger 62 may comprise an air cooled or liquid cooled heat exchanger, for example.

In another embodiment, substrate 14 comprises a metal or metal composite material and includes embedded channels 70 therein to permit incorporation of a heat exchanger and to avoid needing any other cooling structures for the package. The channels within the substrate can be designed to provide channels for cooling using fluids, gasses or phase changing material. Exemplary embodiments for integrated cooling channels are described in commonly assigned Stevanovic et al., U.S. patent application Ser. No. 10/998707 filed 24 Nov. 2004.

In embodiments without such embedded channels, it is useful to attach substrate 14 to a heat exchanger (not shown) to facilitate power semiconductor device cooling.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A power circuit package comprising:
   a base comprising a substrate, a plurality of interconnect circuit layers over the substrate with each comprising a substrate insulating layer patterned with substrate electrical interconnects, and via connections, extending from a top surface of the substrate to at least one of the substrate electrical interconnects;
   a power semiconductor module comprising power semiconductor devices each comprising device pads on a top surface of the respective power semiconductor device and backside contacts on a bottom surface of the respective power semiconductor device, the power semiconductor devices being coupled to a membrane structure, the membrane structure comprising a membrane insulating layer and membrane electrical interconnects over the membrane insulating layer and selectively extending to the device pads, wherein the backside contacts are coupled to selected substrate electrical interconnects or via connections; and
   surface mount components coupled to selected substrate electrical interconnects or via connections.

2. The power circuit package of claim 1 wherein the surface mount components comprise at least one component selected from the group consisting of passive surface components and active surface components.

3. The power circuit package of claim 1 wherein the surface mount components comprise at least one passive circuit component from the group consisting of resistors, capacitors, and inductors.

4. The power circuit package of claim 1 wherein the surface mount components comprise at least one active circuit component from the group consisting of gate drive circuits, current sensors, voltage sensors, thermal sensors, processing electronics, optoelectronics, and conditioning electronics.

5. The power circuit package of claim 1 wherein at least some of the via connections are configured for thermal and electrical coupling.

6. The power circuit package of claim 1 further comprising at least two types of solder for coupling of the power semiconductor module and the surface mount components, one type of solder for coupling the power semiconductor module having a higher reflow temperature than another type of solder for coupling at least one surface mount component.

7. The power circuit package of claim 1 further comprising solder configured for coupling of the power semiconductor module.

8. The power circuit package of claim 1 further comprising potting material at least partially surrounding the power semiconductor module.

9. The power circuit package of claim 8 further comprising a frame coupled to the top surface of the substrate and supporting the potting material, wherein the potting material additionally surrounds at least some of the surface mount components.

10. The power circuit package of claim 9 further comprising output connectors coupled to selected electrical interconnects or via connections and partially surrounded by the potting material so as to be accessible for external coupling.

11. A power circuit package comprising:
    a base comprising a substrate, a plurality of interconnect circuit layers over the substrate with each comprising a substrate insulating layer patterned with substrate electrical interconnects, and via connections, extending from a top surface of the substrate to at least one of the substrate electrical interconnects;
    a power semiconductor module comprising power semiconductor devices each comprising device cads on a top surface of the respective power semiconductor device and backside contacts on a bottom surface of the respective power semiconductor device, the power semiconductor devices being coupled to a membrane structure, the membrane structure comprising a membrane insulating layer and membrane electrical interconnects over the membrane insulating layer and selectively extending to the device pads, wherein the backside contacts are coupled to selected substrate electrical interconnects or via connections; and a surface mount component coupled on a top surface of the membrane structure.

12. A power circuit package comprising:

a base comprising a substrate, a plurality of interconnect circuit layers over the substrate with each comprising a substrate insulating layer patterned with substrate electrical interconnects, and via connections, extending from a top surface of the substrate to at least one of the substrate electrical interconnects;

a power semiconductor module comprising power semiconductor devices each comprising device cads on a top surface of the respective power semiconductor device and backside contacts on a bottom surface of the respective power semiconductor device, the power semiconductor devices being coupled to a membrane structure, the membrane structure comprising a membrane insulating layer and membrane electrical interconnects over the membrane insulating layer and selectively extending to the device pads, wherein the backside contacts are coupled to selected substrate electrical interconnects or via connections; and a heat exchanger and a thermal interface material coupling the heat exchanger and a top surface of the membrane structure.

13. A power circuit package comprising:

a base comprising a substrate, a plurality of interconnect circuit layers over the substrate with each comprising a substrate insulating layer patterned with substrate electrical interconnects, and via connections, extending from a top surface of the substrate to at least one of the substrate electrical interconnects;

a power semiconductor module comprising power semiconductor devices each comprising device pads on a top surface of the respective power semiconductor device and backside contacts on a bottom surface of the respective power semiconductor device, the power semiconductor devices being coupled to a membrane structure, the membrane structure comprising a membrane insulating layer and membrane electrical interconnects over the membrane insulating layer and selectively extending to the device pads, wherein the backside contacts are coupled to selected substrate electrical interconnects or via connections, wherein the substrate comprises a metal insulated substrate.

14. The power circuit package of claim 13 wherein the substrate further comprises cooling channels embedded therein.

15. A method for fabricating a power circuit package comprising:

providing a base comprising a substrate, a plurality of interconnect circuit layers over the substrate with each comprising a substrate insulating layer patterned with substrate electrical interconnects, and via connections extending from a top surface of the substrate to at least one of the electrical interconnects;

providing a power semiconductor module comprising power semiconductor devices each comprising device pads on a top surface and backside contacts on a bottom surface, the power semiconductor devices being coupled to a membrane structure, the membrane structure comprising a membrane insulating layer and membrane electrical interconnects over the membrane insulating layer and selectively extending to the device pads;

mounting the power semiconductor module to selected electrical interconnects or via connections of the base.

16. The method of claim 15, further comprising providing surface mount components, and mounting the surface mount components to selected electrical interconnects or via connections of the base.

17. The method of claim 16 further comprising applying potting material at least partially surrounding the power semiconductor module.

18. The method of claim 17 wherein applying the potting material comprises coupling a frame to the top surface of the substrate and supplying the potting material in the frame.

19. The method of claim 16 wherein the surface mount components comprise at least one component selected from the group consisting of passive surface components and active surface components.

20. The method of claim 16 wherein mounting the power semiconductor module and the surface mount components comprises simultaneously soldering the power semiconductor module and the surface mount components.

21. The method of claim 16 wherein mounting the power semiconductor module and the surface mount components comprises soldering the power semiconductor module and then soldering the surface mount components.

* * * * *

UNITED STATES PATENT AND TRADEMARK OFFICE
CERTIFICATE OF CORRECTION

PATENT NO. : 7,518,236 B2  Page 1 of 1
APPLICATION NO. : 11/259992
DATED : April 14, 2009
INVENTOR(S) : Delgado et al.

It is certified that error appears in the above-identified patent and that said Letters Patent is hereby corrected as shown below:

In Column 6, Line 64, in Claim 11, delete "cads" and insert -- pads --, therefor.

In Column 7, Line 20, in Claim 12, delete "cads" and insert -- pads --, therefor.

Signed and Sealed this

Thirtieth Day of June, 2009

JOHN DOLL
*Acting Director of the United States Patent and Trademark Office*